(12) United States Patent
Zukerman et al.

(10) Patent No.: US 11,500,125 B2
(45) Date of Patent: Nov. 15, 2022

(54) SEISMIC HAZARD DETERMINATION METHOD AND SYSTEM

(71) Applicant: City University of Hong Kong, Kolwoon (HK)

(72) Inventors: Moshe Zukerman, Kowloon (HK); Zengfu Wang, Xi'an (CN); Gang Wang, Kowloon (HK); Yu Wang, Kowloon (HK); Xinyu Wang, Kowloon (HK); William Moran, Balwyn (AU); Qing Wang, Kowloon (HK); Yanni Sun, Kowloon (HK)

(73) Assignee: City University of Hong Kong, Kowloon (HK)

( * ) Notice: Subject to any disclaimer, the term of this patent is extended or adjusted under 35 U.S.C. 154(b) by 242 days.

(21) Appl. No.: 16/889,663

(22) Filed: Jun. 1, 2020

(65) Prior Publication Data
US 2021/0373199 A1    Dec. 2, 2021

(51) Int. Cl.
*G01V 99/00* (2009.01)
*G06F 30/27* (2020.01)
*G01V 1/00* (2006.01)

(52) U.S. Cl.
CPC ............ *G01V 99/005* (2013.01); *G01V 1/008* (2013.01); *G06F 30/27* (2020.01)

(58) Field of Classification Search
CPC ....... G01V 99/005; G01V 1/008; G06F 30/27
USPC ..................................................... 703/6, 10
See application file for complete search history.

(56) References Cited

U.S. PATENT DOCUMENTS

| | | | |
|---|---|---|---|
| 2019/0137639 A1* | 5/2019 | Walsh, III | G06N 7/005 |
| 2021/0312351 A1* | 10/2021 | Pourmohammad | G06Q 10/0635 |

OTHER PUBLICATIONS

Mert, A. "Physically based ground motion prediction and validation: a case study medium-size magnitude Marmara Sea earthquakes." Bulletin of Earthquake Engineering 16.5 (2018). pp. 1779-1800. (Year: 2018).*

(Continued)

*Primary Examiner* — John E Johansen
(74) *Attorney, Agent, or Firm* — Renner Kenner Greive Bobak Taylor & Weber

(57) ABSTRACT

A computer-implemented method and a related system for determining seismic hazard related data. The method includes processing geological/seismological data associated with an area of unknown hazard using a simulation model, and determining simulated ground motion intensity data associated with the area of unknown hazard. The simulation model is determined based on geological/seismological data associated with an area of known hazard and ground motion intensity data associated with the area of known hazard. Alternatively, or additionally, the method includes processing simulated ground motion intensity data associated with the area of unknown hazard with another simulation model. Such simulation model is determined at least partly based on: geological/seismological data associated with an area of unknown hazard, geological/seismological data associated with an area of known hazard, ground motion intensity data associated with the area of known hazard, and simulated ground motion intensity data associated with the area of known hazard.

17 Claims, 8 Drawing Sheets

(56) References Cited

OTHER PUBLICATIONS

Huang D, Wang, G., Du, C., Jin, F., Feng, K., Chen, Z. (2020). An integrated SEM-Newmark model for physics-based regional coseismic landslide assessment, Earthquake Engineering and Soil Dynamics, 132, 106066. DOI:10.1016/j.soildyn.2020. 106066.

Y. Wang, T. Zhao, "Statistical interpretation of soil property profiles from sparse data using bayesian compressive sampling." G'eotechnique 67, 2016, 523-536.

Z. Wang, Q. Wang, B. Moran and M. Zukerman, "Application of the Fast Marching Method for Path Planning of Long-haul Optical Fiber Cables With Shielding," IEEE Access, vol. 6, No. 1, pp. 41367-41378, Dec. 2018. https://ieeexplore.ieee.org/document/8408789/.

G. Wang, C. Du, D. Huang, F. Jin, R. C. Koo, J. S. Kwan, Parametric models for 3D topographic amplification of ground motions considering subsurface soils, Soil Dynamics and Earthquake Engineering 115 (2018) 41-54.

Z. Wang, Q. Wang, M. Zukerman and B. Moran, "A Seismic Resistant Design Algorithm for Laying and Shielding of Optical Fiber Cables," IEEE/OSA Journal of Lightwave Technology, vol. 35, No. 14, pp. 3060-3074, Jul. 2017. http://www.ee.cityu.edu.hk/~zukerman/J161.pdf.

Z. Wang, Q. Wang, M. Zukerman, J. Guo, Y. Wang, G. Wang, J. Yang and B. Moran, "Multiobjective Path Optimization for Critical Infrastructure Links with Consideration to Seismic Resilience," Computer-Aided Civil and Infrastructure Engineering, vol. 32, No. 10, pp. 836-855, Oct. 2017.

Z. Wang, Q. Wang, B. Moran and M. Zukerman, "Terrain Constrained Path Planning for Long-haul Cables," Optics Express, vol. 27, No. 6, pp. 8221-8235, Mar. 2019. https://www.ee.cityu.edu.hk/~zukerman/J168.pdf.

Q. Wang, J. Guo, Z. Wang, E. Tahchi, X. Wang, B. Moran, and M. Zukerman, "Cost-Effective Path Planning for Submarine Cable Network Extension," IEEE Access, vol. 7, No. 1, pp. 61883-61895, May 2019. https://ieeexplore.ieee.org/document/8708281.

\* cited by examiner

SEISMIC HAZARD DETERMINATION METHOD AND SYSTEM

TECHNICAL FIELD

The invention relates to systems and methods for determining seismic hazard, in particular for area in which such hazard information is lacking or incomplete.

BACKGROUND

Infrastructures such as electricity/power systems, oil systems, water systems, fuel systems, gas, systems, communications systems, transportation systems, etc., are essential to the proper functioning of modern economies and societies. As the world becomes increasingly interconnected, cross-area, trans-regional, trans-national, or even trans-continental infrastructure links becomes increasingly important.

One specific type of infrastructure link is submarine telecommunications cable system. Such cable system currently spans over a million km worldwide, and it is expected to reach two million km in the foreseeable future. As one would expect, a substantial amount of cost will have to be spent on the development and maintenance of the worldwide submarine cable infrastructure. The determination of the arrangement of submarine cable infrastructure is complicated, as it may depend on cost factors as well as various environmental and human factors which present risks that may affect integrity, performance, ease of arrangement, repair, etc., of the infrastructure. Natural disasters (such as earthquake, volcanic activity, landslides, turbid flows, etc.) and human activities (such as fishing, mooring, resource exploration, etc.) may all potentially damage the cables. The cables, if damaged, will catastrophically disrupt telecommunication services (e.g., internet connectivity) in or across different areas, regions, or even countries.

Reliable determination of infrastructure links path arrangement requires, among other things, ground motion data that is complete and accurate (as far as possible). Problematically, there are many areas in the world where only limited seismic (e.g., earthquake) hazard information is available. This remains a challenge to be addressed.

SUMMARY OF THE INVENTION

In a first aspect of the invention, there is provided a computer-implemented method for determining seismic hazard related data. The method includes processing geological and/or seismological data associated with an area of unknown hazard using a simulation model, and determining, based on the processing, simulated ground motion intensity data associated with the area of unknown hazard. The simulation model is determined at least partly based on geological and/or seismological data associated with an area of known hazard and ground motion intensity data associated with the area of known hazard. Area of known hazards may include one or more known seismically-active area, which may be onshore areas, offshore areas, or both. Area of unknown hazards may include area in which actual geological and/or seismological data is limited, incomplete, or non-existent, and which may include onshore areas, offshore areas, or both.

In one embodiment of the first aspect, the simulation model is arranged to correlate (e.g., statistically correlate) geological and/or seismological data with ground motion intensity data.

In one embodiment of the first aspect, the ground motion intensity data associated with the area of known hazard includes: spatial distribution of ground motion with respect to one or more fault ruptures in the area of known hazard; and/or attenuation of ground motion with respect to one or more fault ruptures in the area of known hazard.

In one embodiment of the first aspect, the ground motion intensity data associated with the area of known hazard includes one or more of: peak ground velocity; peak ground acceleration; and spectral acceleration at first mode of vibration.

In one embodiment of the first aspect, the simulated ground motion intensity data associated with the area of unknown hazard includes: simulated spatial distribution of ground motion in the area of unknown hazard with respect to one or more fault ruptures in the area of unknown hazard; and/or simulated attenuation of ground motion with respect to one or more fault ruptures in the area of unknown hazard.

In one embodiment of the first aspect, the simulated ground motion intensity data associated with the area of unknown hazard includes one or more of: peak ground velocity; peak ground acceleration; and spectral acceleration at first mode of vibration.

In one embodiment of the first aspect, the simulation model is a physics-based simulation model. The physics-based simulation model may be formed from or with a machine learning algorithm. The machine learning algorithm may be a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. In the supervised machine learning algorithm, geological and/or seismological data associated with an area of known hazard can be used as input; and ground motion intensity data associated with the area of known hazard can be used as the output corresponding to the input, the model learns or otherwise determines a correlation between the input and the output. The supervised machine learning algorithm may learn or otherwise determine spatial distribution and attenuation of ground motion around a fault rupture.

In one embodiment of the first aspect, the method further includes: prior to the processing, comparing tectonic settings of the area of unknown hazard with the tectonic settings of the area of known hazard to determine a similarity score. The processing is performed only if the similarity score is above a predetermined threshold score, which may be fixed or adjustable.

In one embodiment of the first aspect, the method further includes: prior to the processing, comparing tectonic settings of the area of unknown hazard with respective tectonic settings of a plurality of areas of known hazard to determine a respective similarity score; and determining the area of known hazard with the highest similarity score. The determined area of known hazard with the highest similarity score is the same area as the area of known hazard based on which the physics-based simulation model is determined.

In one embodiment of the first aspect, the geological and/or seismological data associated with the area of unknown hazard comprises the geological and/or seismological data associated with an area of known hazard, in which the area of known hazard and the area of unknown hazard are of similar tectonic properties.

In one embodiment of the first aspect, the geological and/or seismological data associated with the area of known hazard comprises data relating to one or more of: topography data, ground motion data, hazard information, historical earthquake magnitudes, fault rupture area, fault mechanism, site condition, focal depth, and soil types; and the geological and/or seismological data associated with an area of unknown hazard may include data relating to one or more of: topography data, ground motion data, hazard information, historical earthquake magnitudes, fault rupture area, fault mechanism, site condition, focal depth, and soil types. The geological and/or seismological data associated with the area of unknown hazard is less dense or less complete than the geological and/or seismological data associated with the area of known hazard.

In one embodiment of the first aspect, the method further includes: combining the simulated ground motion intensity data associated with the area of unknown hazard with the ground motion intensity data associated with the area of known hazard. The combination may include adding the simulated ground motion intensity data associated with the area of unknown hazard and the ground motion intensity data associated with the area of known hazard, optionally applying respective weighing to the data, with or without averaging.

In one embodiment of the first aspect, the method further includes: presenting the simulated ground motion intensity data associated with the area of unknown hazard. The presentation may include displaying the simulated ground motion intensity data. The simulated ground motion intensity data may be presented or displayed along with the simulated ground motion intensity data associated with the area of known hazard (obtained from the simulation model) and/or (known) ground motion intensity data associated with the area of known hazard. The simulated ground motion intensity data may be overlaid on a map of a modelled geographic terrain.

In one embodiment of the first aspect, the method further includes: prior to the processing, determining the simulation model. Determining the simulation model may include building, training, and/or optimizing the simulation model. Building, training, and/or optimizing the simulation model may involve the use of a machine learning algorithm, in particular a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. In the supervised machine learning algorithm, geological and/or seismological data associated with an area of known hazard can be used as input; and ground motion intensity data associated with the area of known hazard can be used as the output corresponding to the input, the model learns or otherwise determines a correlation between the input and the output. The supervised machine learning algorithm may learn or otherwise determine spatial distribution and attenuation of ground motion around a fault rupture.

In one embodiment of the first aspect, the method further includes: processing geological and/or seismological data associated with an area of known hazard using the simulation model; and determining, based on the processing, simulated ground motion intensity data associated with the area of known hazard; and comparing the determined simulated ground motion intensity data associated with the area of known hazard and the ground motion intensity data associated with the area of known hazard; and optimizing the simulation model based on the comparison.

In one embodiment of the first aspect, the simulation model is the first simulation model, and the method further includes: processing the determined simulated ground motion intensity data associated with the area of unknown hazard with a second simulation model.

In one embodiment of the first aspect, the second simulation model is determined at least partly based on: geological and/or seismological data associated with an area of unknown hazard; geological and/or seismological data associated with an area of known hazard; ground motion intensity data associated with the area of known hazard; and simulated ground motion intensity data associated with the area of known hazard. The second simulation model may be determined based on one or more additional factors, such as predetermined simulated ground motion intensity data associated with the area of unknown hazard. The second simulation model is arranged to correlate, e.g., statistically correlate, geological and/or seismological data associated with an area of unknown hazard, and geological and/or seismological data associated with an area of known hazard with ground motion intensity data associated with the area of known hazard, simulated ground motion intensity data associated with the area of unknown hazard, and simulated ground motion intensity data associated with the area of known hazard (and optionally, predetermined simulated ground motion intensity data associated with the area of unknown hazard).

In one embodiment of the first aspect, the second simulation model comprises a ground motion attenuation model.

In one embodiment of the first aspect, the ground motion attenuation model is a machine-learning-based model. The machine-learning-based model is formed from or with a machine learning algorithm. The machine learning algorithm may be a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. The supervised machine learning algorithm may learn or otherwise determine spatial distribution and attenuation of ground motion around a fault rupture.

In one embodiment of the first aspect, the method further includes: determining the second simulation model based on: geological and/or seismological data associated with an area of unknown hazard; geological and/or seismological data associated with an area of known hazard; ground motion intensity data associated with the area of known hazard; simulated ground motion intensity data associated with the area of unknown hazard; and simulated ground motion intensity data associated with the area of known hazard. Determining the second simulation model may include: building, training, and/or optimizing the second simulation model.

In one embodiment of the first aspect, the method further includes: applying probabilistic seismic hazard analysis to the ground motion attenuation model to determine respective probability of exceeding various levels of ground motion estimated over a specified time period.

In one embodiment of the first aspect, the method further includes: presenting the analysis result. The presentation may include displaying the analysis result, or data (quantified), e.g., in the form of a hazard map, optionally overlaid on a map of a modelled geographic terrain.

In a second aspect of the invention, there is provided a computer-implemented method for determining seismic hazard related data. The method includes processing simulated ground motion intensity data associated with the area of unknown hazard with a simulation model. The simulation model is determined at least partly based on: geological and/or seismological data associated with an area of unknown hazard; geological and/or seismological data associated with an area of known hazard; ground motion intensity data associated with the area of known hazard; and simulated ground motion intensity data associated with the area of known hazard.

In one embodiment of the second aspect, the simulation model may be determined based on one or more additional factors, such as predetermined simulated ground motion intensity data associated with the area of unknown hazard.

In one embodiment of the second aspect, the simulation model is arranged to correlate, e.g., statistically correlate, geological and/or seismological data associated with an area of unknown hazard and geological and/or seismological data associated with an area of known hazard with ground motion intensity data associated with the area of known hazard, simulated ground motion intensity data associated with the area of unknown hazard, and simulated ground motion intensity data associated with the area of known hazard (and optionally, predetermined simulated ground motion intensity data associated with the area of unknown hazard).

In one embodiment of the second aspect, the simulation model comprises a ground motion attenuation model.

In one embodiment of the second aspect, the ground motion attenuation model is a machine-learning-based model. The machine-learning-based model is formed from or with a machine learning algorithm. The machine learning algorithm may be a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. The supervised machine learning algorithm may learn or otherwise determine spatial distribution and attenuation of ground motion around a fault rupture.

In one embodiment of the second aspect, the method further includes determining the simulation model based on: geological and/or seismological data associated with an area of unknown hazard; geological and/or seismological data associated with an area of known hazard; ground motion intensity data associated with the area of known hazard; simulated ground motion intensity data associated with the area of unknown hazard; and simulated ground motion intensity data associated with the area of known hazard.

In one embodiment of the second aspect, determining the simulation model includes: building, training, and/or optimizing the simulation model.

In one embodiment of the second aspect, the method further includes applying probabilistic seismic hazard analysis to the ground motion attenuation model to determine respective probability of exceeding various levels of ground motion estimated over a specified time period.

In one embodiment of the second aspect, the method further includes presenting the analysis result. The presentation may include displaying the analysis result, or data (quantified), e.g., in the form of a hazard map, optionally overlaid on a map of a modelled geographic terrain.

In a third aspect of the invention, there is provided a non-transitory computer readable medium for storing computer instructions that, when executed by one or more processors, causes the one or more processors to perform the method of the first aspect.

In a fourth aspect of the invention, there is provided an article comprising the non-transitory computer readable medium of the third aspect.

In a fifth aspect of the invention, there is provided a computer program product storing instructions and/or data that are executable by one or more processors, the instructions and/or data are arranged to cause the one or more processors to perform the method of the first aspect.

In a sixth aspect of the invention, there is provided a non-transitory computer readable medium for storing computer instructions that, when executed by one or more processors, causes the one or more processors to perform the method of the second aspect.

In a seventh aspect of the invention, there is provided an article comprising the non-transitory computer readable medium of the sixth aspect.

In a eighth aspect of the invention, there is provided a computer program product storing instructions and/or data that are executable by one or more processors, the instructions and/or data are arranged to cause the one or more processors to perform the method of the second aspect.

In a ninth aspect of the invention, there is provided a system for determining seismic hazard related data. The system includes one or more processors; and memory operably connecting with the one or more processors and storing a simulation model determined at least partly based on geological and/or seismological data associated with an area of known hazard and ground motion intensity data associated with the area of known hazard. The one or more processors are arranged to process geological and/or seismological data associated with an area of unknown hazard using a simulation model, the; and determine, based on the processing, simulated ground motion intensity data associated with the area of unknown hazard. Area of known hazards may include one or more known seismically-active area, which may be onshore areas, offshore areas, or both. Area of unknown hazards may include area in which actual geological and/or seismological data is limited, incomplete, or non-existent, and which may include onshore areas, offshore areas, or both. The simulation model may be stored in the memory.

In one embodiment of the ninth aspect, the simulation model is arranged to correlate (e.g., statistically correlate) geological and/or seismological data with ground motion intensity data.

In one embodiment of the ninth aspect, the ground motion intensity data associated with the area of known hazard includes: spatial distribution of ground motion with respect to one or more fault ruptures in the area of known hazard; and/or attenuation of ground motion with respect to one or more fault ruptures in the area of known hazard.

In one embodiment of the ninth aspect, the ground motion intensity data associated with the area of known hazard includes one or more of: peak ground velocity; peak ground acceleration; and spectral acceleration at first mode of vibration.

In one embodiment of the ninth aspect, the simulated ground motion intensity data associated with the area of unknown hazard includes: simulated spatial distribution of ground motion in the area of unknown hazard with respect to one or more fault ruptures in the area of unknown hazard; and/or simulated attenuation of ground motion with respect to one or more fault ruptures in the area of unknown hazard.

In one embodiment of the ninth aspect, the simulated ground motion intensity data associated with the area of unknown hazard includes one or more of: peak ground velocity; peak ground acceleration; and spectral acceleration at first mode of vibration.

In one embodiment of the ninth aspect, the simulation model is a physics-based simulation model. The physics-based simulation model may be formed from or with a machine learning algorithm. The machine learning algorithm may be a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. In the supervised machine learning algorithm, geological and/or seismological data associated with an area of known hazard can be used as input; and ground motion intensity data associated with the area of known hazard can be used as the output corresponding to the input, the model learns or otherwise determines a correlation between the input and the output. The supervised machine learning algorithm may learn or otherwise determine spatial distribution and attenuation of ground motion around a fault rupture.

In one embodiment of the ninth aspect, the one or more processors are further arranged to: prior to the processing, compare tectonic settings of the area of unknown hazard with the tectonic settings of the area of known hazard to determine a similarity score. The one or more processors are arranged to perform the processing only if the similarity score is above a predetermined threshold score, which may be fixed or adjustable.

In one embodiment of the ninth aspect, the one or more processors are further arranged to: prior to the processing, compare tectonic settings of the area of unknown hazard with respective tectonic settings of a plurality of areas of known hazard to determine a respective similarity score; and determine the area of known hazard with the highest similarity score. The determined area of known hazard with the highest similarity score is the same area as the area of known hazard based on which the physics-based simulation model is determined.

In one embodiment of the ninth aspect, the geological and/or seismological data associated with the area of unknown hazard comprises the geological and/or seismological data associated with an area of known hazard, in which the area of known hazard and the area of unknown hazard are of similar tectonic properties.

In one embodiment of the ninth aspect, the geological and/or seismological data associated with the area of known hazard comprises data relating to one or more of: topography data, ground motion data, hazard information, historical earthquake magnitudes, fault rupture area, fault mechanism, site condition, focal depth, and soil types; and the geological and/or seismological data associated with an area of unknown hazard may include data relating to one or more of: topography data, ground motion data, hazard information, historical earthquake magnitudes, fault rupture area, fault mechanism, site condition, focal depth, and soil types. The geological and/or seismological data associated with the area of unknown hazard is less dense or less complete than the geological and/or seismological data associated with the area of known hazard.

In one embodiment of the ninth aspect, the one or more processors are further arranged to: combine the simulated ground motion intensity data associated with the area of unknown hazard with the ground motion intensity data associated with the area of known hazard. For example, the one or more processors may be arranged to add the simulated ground motion intensity data associated with the area of unknown hazard and the ground motion intensity data associated with the area of known hazard, optionally applying respective weighing to the data, with or without averaging.

In one embodiment of the ninth aspect, the system further includes one or more output devices arranged to present the simulated ground motion intensity data associated with the area of unknown hazard. The output device may include a display arranged to display the simulated ground motion intensity data. The simulated ground motion intensity data may be presented or displayed along with the simulated ground motion intensity data associated with the area of known hazard (obtained from the simulation model) and/or (known) ground motion intensity data associated with the area of known hazard. The simulated ground motion intensity data may be overlaid on a map of a modelled geographic terrain.

In one embodiment of the ninth aspect, the one or more processors are further arranged to: prior to the processing, determine the simulation model. The one or more processors are arranged to determine the simulation model by, e.g., building, training, and/or optimizing the simulation model. The one or more processors are arranged to build, train, and/or optimize the simulation model using a machine learning algorithm, in particular a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. In the supervised machine learning algorithm, geological and/or seismological data associated with an area of known hazard can be used as input; and ground motion intensity data associated with the area of known hazard can be used as the output corresponding to the input, the model learns or otherwise determines a correlation between the input and the output. The supervised machine learning algorithm may learn or otherwise determine spatial distribution and attenuation of ground motion around a fault rupture.

In one embodiment of the ninth aspect, the one or more processors are further arranged to: process geological and/or seismological data associated with an area of known hazard using the simulation model; and determine, based on the processing, simulated ground motion intensity data associated with the area of known hazard; and compare the determined simulated ground motion intensity data associated with the area of known hazard and the ground motion intensity data associated with the area of known hazard; and optimizing the simulation model based on the comparison.

In one embodiment of the ninth aspect, the simulation model is the first simulation model, and the one or more processors are further arranged to: process the determined simulated ground motion intensity data associated with the area of unknown hazard with a second simulation model.

In one embodiment of the ninth aspect, the second simulation model is determined at least partly based on: geological and/or seismological data associated with an area of unknown hazard; geological and/or seismological data associated with an area of known hazard; ground motion intensity data associated with the area of known hazard; and simulated ground motion intensity data associated with the area of known hazard. The second simulation model may be determined based on one or more additional factors, such as predetermined simulated ground motion intensity data associated with the area of unknown hazard. The second simulation model is arranged to correlate, e.g., statistically correlate, geological and/or seismological data associated with an area of unknown hazard, and geological and/or seismological data associated with an area of known hazard with ground motion intensity data associated with the area of known hazard, simulated ground motion intensity data associated with the area of unknown hazard, and simulated ground motion intensity data associated with the area of known hazard (and optionally, predetermined simulated ground motion intensity data associated with the area of unknown hazard).

In one embodiment of the ninth aspect, the second simulation model comprises a ground motion attenuation model.

In one embodiment of the ninth aspect, the ground motion attenuation model is a machine-learning-based model. The machine-learning-based model is formed from or with a machine learning algorithm. The machine learning algorithm may be a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. The supervised machine learning algorithm may learn or otherwise determine spatial distribution and attenuation of ground motion around a fault rupture.

In one embodiment of the ninth aspect the one or more processors are further arranged to: determine the second simulation model based on: geological and/or seismological data associated with an area of unknown hazard; geological and/or seismological data associated with an area of known hazard; ground motion intensity data associated with the area of known hazard; simulated ground motion intensity data associated with the area of unknown hazard; and simulated ground motion intensity data associated with the area of known hazard. The one or more processors are further arranged to determine the second simulation model by, e.g., building, training, and/or optimizing the second simulation model.

In one embodiment of the ninth aspect, the one or more processors are further arranged to: apply probabilistic seismic hazard analysis to the ground motion attenuation model to determine respective probability of exceeding various levels of ground motion estimated over a specified time period.

In one embodiment of the ninth aspect, the system further includes one or more output devices arranged to present the analysis result. The output device may be a display arranged to display the analysis result, or data, e.g., in the form of a hazard map, optionally overlaid on a map of a modelled geographic terrain.

In a tenth aspect of the invention, there is provided a system for determining seismic hazard related data. The system includes one or more processors; and memory operably connecting with the one or more processors and storing a simulation model determined at least partly based on geological and/or seismological data associated with an area of unknown hazard; geological and/or seismological data associated with an area of known hazard; ground motion intensity data associated with the area of known hazard; and simulated ground motion intensity data associated with the area of known hazard. The one or more processors are arranged to process simulated ground motion intensity data associated with the area of unknown hazard with a simulation model.

In one embodiment of the tenth aspect, the simulation model may be determined based on one or more additional factors, such as predetermined simulated ground motion intensity data associated with the area of unknown hazard.

In one embodiment of the tenth aspect, the simulation model is arranged to correlate, e.g., statistically correlate, geological and/or seismological data associated with an area of unknown hazard and geological and/or seismological data associated with an area of known hazard with ground motion intensity data associated with the area of known hazard, simulated ground motion intensity data associated with the area of unknown hazard, and simulated ground motion intensity data associated with the area of known hazard (and optionally, predetermined simulated ground motion intensity data associated with the area of unknown hazard).

In one embodiment of the tenth aspect, the simulation model comprises a ground motion attenuation model.

In one embodiment of the tenth aspect, the ground motion attenuation model is a machine-learning-based model. The machine-learning-based model is formed from or with a machine learning algorithm. The machine learning algorithm may be a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. The supervised machine learning algorithm may learn or otherwise determine spatial distribution and attenuation of ground motion around a fault rupture.

In one embodiment of the tenth aspect, the one or more processors are further arranged to determine the simulation model based on: geological and/or seismological data associated with an area of unknown hazard; geological and/or seismological data associated with an area of known hazard; ground motion intensity data associated with the area of known hazard; simulated ground motion intensity data associated with the area of unknown hazard; and simulated ground motion intensity data associated with the area of known hazard. The one or more processors may be arranged to determine the simulation model by, e.g., building, training, and/or optimizing the simulation model.

In one embodiment of the tenth aspect, the one or more processors are further arranged to apply probabilistic seismic hazard analysis to the ground motion attenuation model to determine respective probability of exceeding various levels of ground motion estimated over a specified time period.

In one embodiment of the tenth aspect, the system further includes one or more output devices arranged to present the analysis result. The output device may be a display arranged to display the analysis result, or data, e.g., in the form of a hazard map, optionally overlaid on a map of a modelled geographic terrain.

In a eleventh aspect of the invention, there is provided a computer-implemented method for determining a path arrangement of an infrastructure link. The method includes receiving one or more inputs each indicative of a constraint; and processing the one or more inputs and a set of data based on a path arrangement determination model. The set of data includes data representing one or more factors affecting the path arrangement. The method also includes determining, based on the processing, the path arrangement of the infrastructure link. The set of data includes data determined from the method of the first aspect and/or the second aspect. The processing may include iteratively processing the set of data at increasing resolution or size based on the path arrangement determination model. The number of iterations in the iteratively processing step may be predetermined. The number of iterations in the iteratively processing step may be fixed or may be adjustable. The one or more inputs may include an input indicative of a set number of iteration (the number of iteration as a constraint on the number of iterations).

In a twelfth aspect of the invention, there is provided a system for determining a path arrangement of an infrastructure link. The system includes one or more processors arranged to: receive one or more inputs each indicative of a constraint; and process the one or more inputs and a set of data based on a path arrangement determination model. The set of data includes data representing one or more factors affecting the path arrangement. The one or more processors are also arranged to determine, based on the processing, the path arrangement of the infrastructure link. The set of data includes data determined from the method of the first aspect and/or the second aspect. The one or more processors may be arranged to iteratively process the set of data at increasing resolution or size based on the path arrangement determination model. The number of iterations in the iteratively processing step may be predetermined. The number of iterations in the iteratively processing step may be fixed or may be adjustable. The one or more inputs may include an input indicative of a set number of iteration (the number of iteration as a constraint on the number of iterations).

In a thirteenth aspect of the invention, there is provided a non-transitory computer readable medium for storing computer instructions that, when executed by one or more processors, causes the one or more processors to perform the method of the first aspect.

In a fourteenth aspect of the invention, there is provided an article comprising the non-transitory computer readable medium of the thirteenth aspect.

In a fifteenth aspect of the invention, there is provided a computer program product storing instructions and/or data that are executable by one or more processors, the instructions and/or data are arranged to cause the one or more processors to perform the method of the eleventh aspect.

BRIEF DESCRIPTION OF THE DRAWINGS

Embodiments of the invention will now be described, by way of example, with reference to the accompanying drawings in which.

DETAILED DESCRIPTION

One or more of the inventors of this invention have devised various computer-implemented methods and systems for infrastructure link path planning. These work include U.S. Non-Provisional patent application Ser. No. 15/785,793, filed on 17 Oct. 2017, entitled "Method for Determining Optimal Laying Arrangement of Infrastructure Link", granted as U.S. Pat. No. 10,425,280; U.S. Non-Provisional patent application Ser. No. 15/992,480, filed on 30 May 2018, entitled "System and Method for Determining Optimal Path Arrangements for an Infrastructure Link with Two or More Design Levels"; U.S. Non-Provisional patent application Ser. No. 15/992,559, filed on 30 May 2018, entitled "System and Method for Determining Optimal Path Arrangements for an Infrastructure Link with Terrain Slope Consideration"; U.S. Non-Provisional patent application Ser. No. 16/123,471, filed on 6 Sep. 2018, entitled "System and Method for Analyzing Survivability of an Infrastructure Link"; and U.S. Non-Provisional patent application Ser. No. 16/265,337, filed on 1 Feb. 2019, entitled "System and Method for Determining an Optimal Path Arrangement of an Infrastructure Link Network", the entire contents of each and all of these five US non-provisional patent applications are incorporated herein by reference.

The inventors of this invention have realized, through research, experiments, and/or trials, that existing methods for infrastructure link path planning face a significant difficulty associated with the massive amount of data required to be processed for determining the suitable path arrangement in view of various factors and constraints. The inventors have recognized that the search for high-quality (refined, accurate, etc.) path design generally requires a large amount of data, which results in computational problems that may be difficult if not impossible to solve (considering computing time and/or computation resource).

Figure 1:
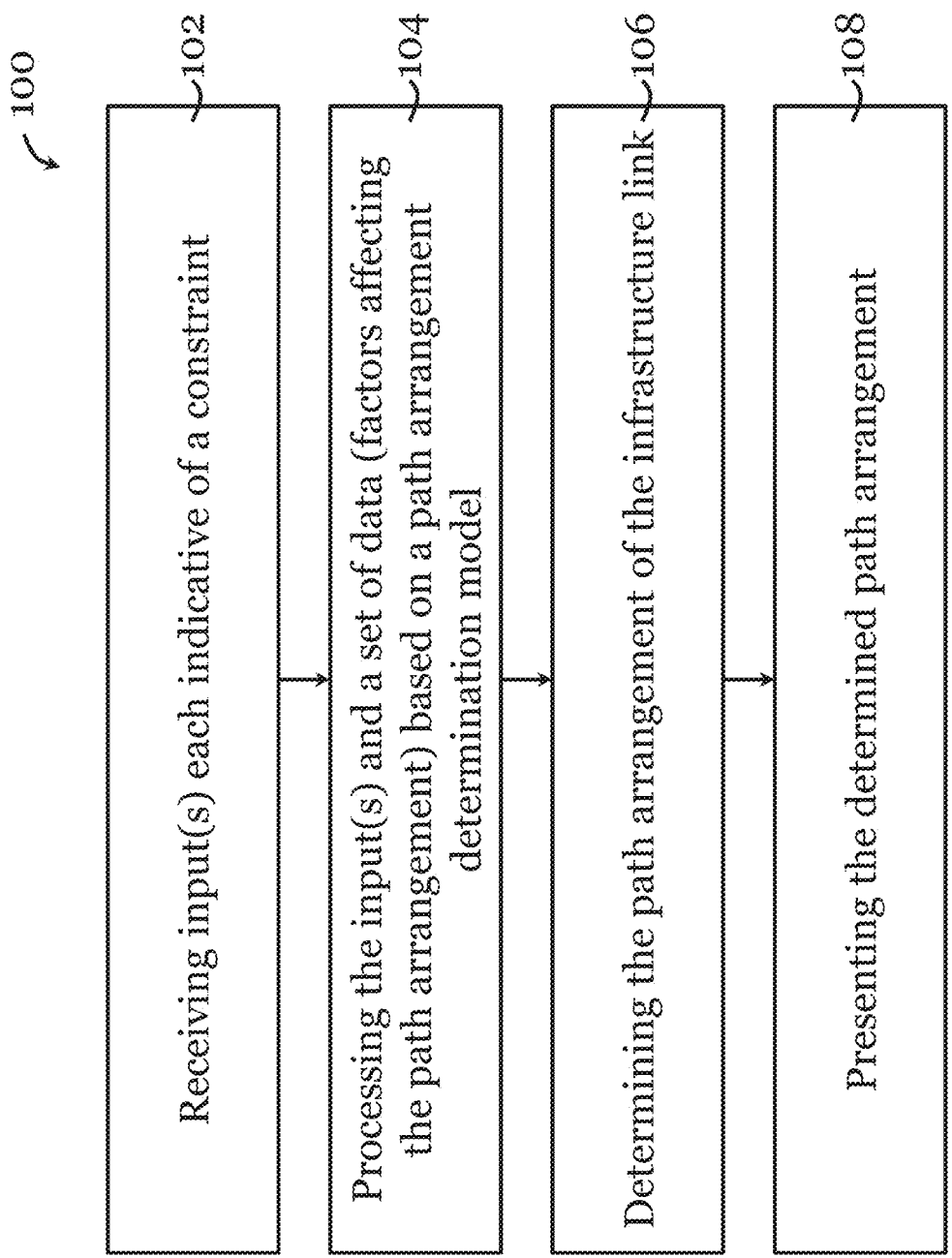
FIG. 1 is a flowchart of a method for determining a path arrangement of an infrastructure link in one embodiment of the invention.

FIG. 1 is a method 100 for determining a path arrangement of an infrastructure link in one embodiment of the invention. The method 100 begins in step 102, in which one or more inputs, each indicative of a constraint, is received. The input(s) may be received by one or more processors via a user interface (e.g., input device). The input may include an input indicative of a (e.g., quantified) risk-level related constraint, an input indicative of a (e.g., quantified) cost related constraint, and/or an input indicative of a (e.g., quantified) protection level related constraint. The determined path arrangement may represent a path arrangement of least cost with respect to a predetermined risk level, a path arrangement of lowest risk level with respect to a predetermined cost, and/or a path arrangement of least cost or least risk-level with respect to a predetermined protection level.

Subsequently, in step 104, the method 100 then processes the one or more inputs and a set of data based on a path arrangement determination model. The set of data includes data representing one or more factors affecting the path arrangement. The factors may include environmental factors and human factors. The factors may include one or more quantified geographic attributes of a geographic terrain in which the infrastructure link can be or is to be arranged. The one or more quantified geographic attributes may include topographical attributes or seismological attributes. The topographical attributes may, for example, be elevation attributes and/or bathymetry attributes. The seismological attributes may represent seismic-activities related hazard such as earthquake hazard. The path arrangement determination model may be based on fast marching method or the methods disclosed in the US non-provisional patent applications which have been entirely incorporated herein by reference. The processing step may also include modelling a geographic terrain in which the path arrangement of the infrastructure link is to be arranged. The geographic terrain may include onshore, offshore, land, and/or sub-sea terrain. The modelling may include modelling the geographic terrain into a terrain model with multiple nodes, e.g., as a triangulated piecewise-linear 2D manifold, as disclosed in the US non-provisional patent applications which have been entirely incorporated herein by reference.

In step 106, the method 100 determines the path arrangement of the infrastructure link based on the processing.

In step 108, the determined path arrangement is presented. In one example, the presentation may include displaying the determined path arrangement on a display. The determined path arrangement may be overlaid on a map of the modelled geographic terrain.

Figure 2:
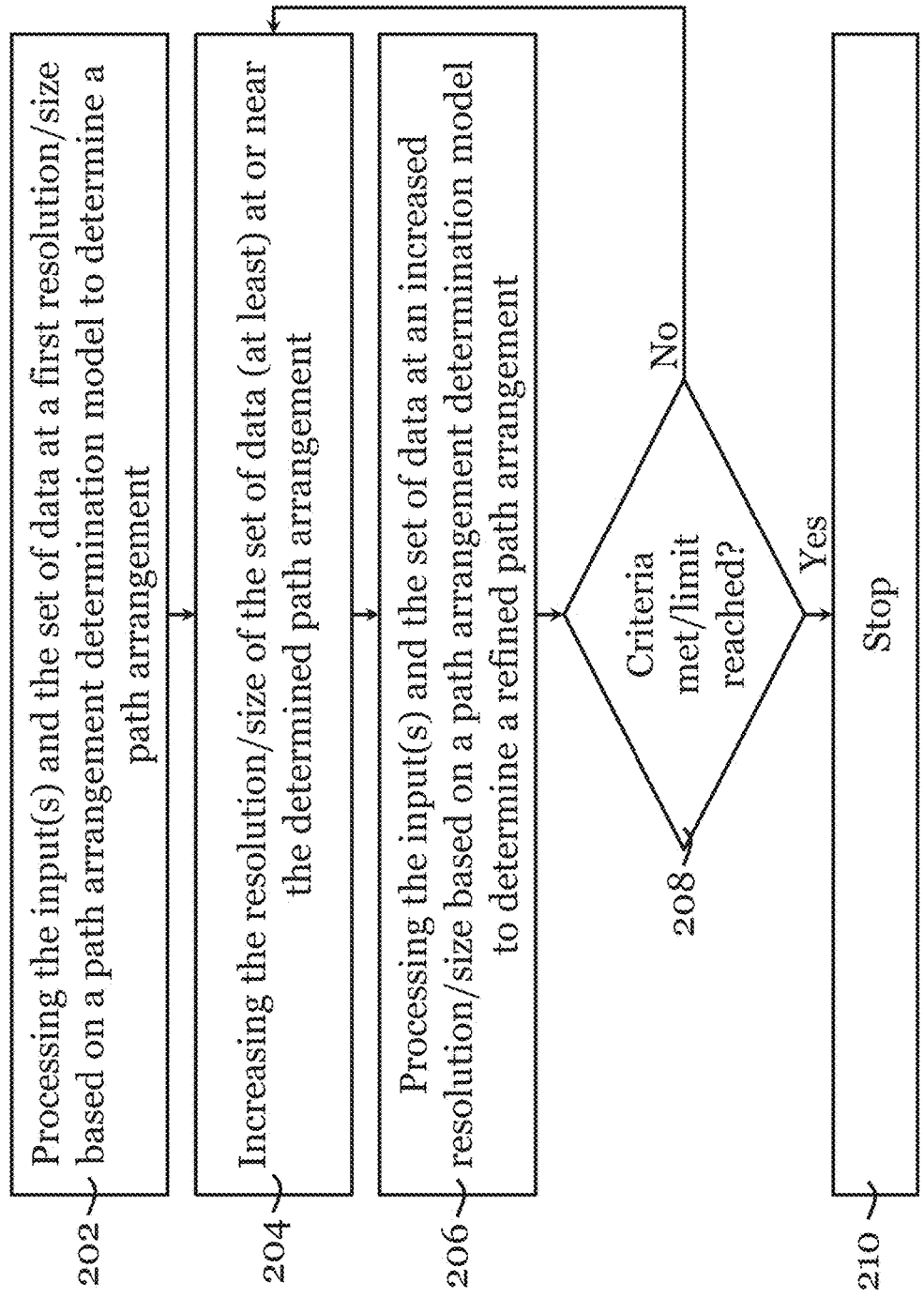
FIG. 2 is a flowchart of a method for determining a path arrangement of an infrastructure link in one embodiment of the invention.

FIG. 2 is a method 200 for determining a path arrangement of an infrastructure link in one embodiment of the invention. The method 200 may be part of the method step 104 in the method 100 of FIG. 1. Broadly speaking, the method 200 involves iteratively processing the set of data at increasing resolution or size based on the path arrangement determination model.

The method 200 begins in step 202, in which the input(s) and the set of data at a first resolution or size is processed based on the path arrangement determination model to determine a path arrangement. As mentioned, the path arrangement determination model may be based on fast marching method or the methods disclosed in the US non-provisional patent applications which have been entirely incorporated herein by reference.

After the path arrangement is determined, in step 204, the method 200 increases the resolution or size of at least part of the set of data, the at least part of the set of data includes data at or near the determined path arrangement. Optionally, the method maintains or decreases the resolution or size of, or discards the other part of the set of data. The increase in resolution or size may be performed segment-wise along the path arrangement determined in step 202.

Then, in step 206, the input(s) and the set of data (i.e., the at least part of the data which has been processed to have increased resolution/size) is processed based on the path arrangement determination model to determine a refined path arrangement. The refined path arrangement represents a more accurate path arrangement than the path arrangement determined in step 202. The path arrangement determination model is substantially the same as the path arrangement determination model used in step 202.

After the refined path arrangement is determined, in step 208, a determination is made as to whether a predefined iteration completion criteria or iteration limit is reached. The iteration limit may be part of the input. If the criterion is met or the iteration limit is reached, the method 200 then stops the processing in step 210. In one example, after step 210, the method 200 may then return to step 106 or 108 of method 100 of FIG. 1. Alternatively, if the criterion is not met or the iteration limit is not reached, the method 200 will return to step 204, which further increases the resolution or size of at least part of the set of data, the at least part of the set of data includes data at or near the latest determined refined path arrangement. The increase in resolution or size may be linear or non-linear.

In method 200, the set of data used is initially at a high resolution, and the method 200 processes it first using its low resolution version (for increased computation speed) and subsequently using increasingly-higher resolution version(s) (for increased accuracy). In method 200, the set of data may be down-sampled, down-sized, or spatially averaged to reduce its resolution or size. The reduction is resolution or size may be local (specific areas) or global (applies to all data).

The set of data used in the methods 100, 200 may be obtained from public domain or private enterprises. For example, the set of data may include topographic and seismological data obtained from publicly available sources such as National Oceanic and Atmospheric Administration (NASA, https://data.nasa.gov/), the General Bathymetric Chart of the Oceans (GEBCO, https://www.gebco.net/) and the United States Geological Survey (USGS, https://www.usgs.gov/). The set of data may include high resolution global digital elevation data sampled at 1 arc-second of latitude and longitude (about 30 meters) obtained by NASA, available on the USGS Earth Explorer. The set of data may include bathymetry data for the world's oceans at 15 arc-second intervals, obtained from GEBCO. The set of data may include extensive gridded data of seismic hazard for US and some other regions outside the US, available from USGS, with 30 arc-second increments in longitude and latitude. The set of data may include data from other sources, for example, http://gmo.gfz-potsdam.de and https://maps.openquake.org, which provide global seismic hazard maps. These seismic hazard maps mainly cover on-shore areas. The set of data may include information on tectonics, global fault locations, past history of earthquakes and ground shaking produced by past earthquakes, landslides, and locations of volcanoes etc., provided by USGS. The set of data may include confidential private data form private enterprises concerning sediment hardness, fishing areas, environmentally sensitive areas, military areas, resource mining areas. The set of data may include bathymetry data at 10 meters intervals in specific regions in the areas where the private enterprises laid cables. Information of submarine cables around the world that have been broken due to various reasons in the history may be used to help optimize the path planning.

The elevation data obtained from public domain or private enterprises may be further processed to improve usability. For example, the coordinate transformation for the geographic data may be applied to convert the elevation data from latitude and longitude coordinates to Universal Transverse Mercator coordinates. A triangulated piecewise-linear two-dimensional manifold M can then be used to approximate the earth's landforms. Elevation data from different data sources may be integrated.

Various factors can be quantified for use in the above embodiments. In one example, to quantify earthquake hazards, cable breakage risk is measured using the commonly used metric in the field of earthquake engineering known as the number of potential repairs (or failures), which has a well-established, statistically validated relationship with ground motion intensities. Attributes of geographical locations, such as seismic hazards, slope, fishing activities, areas of ecological value, existing submarine cables and pipelines, etc., may be considered. Additional protection (reinforcement, armour, shielding or extra material) may improve cable resilience in certain hazardous areas, but with additional upfront cost. Different levels of protection for submarine fiber cables, varying with sea depth, are available through different armour strengths. The construction cost and breakage risk models may take account of the protection level.

The inventions disclosed in the US non-provisional patent applications which have been entirely incorporated herein by reference alleviated the computation difficulties associated with a large search space, e.g., by using FMM that finds shortest path over a continuous manifold. FMM achieves a significant reduction in run time compared to a raster-based algorithm that uses a discrete graph for modelling the earth's surface. However, with higher resolution (which enables better quality solutions), even using FMM, path planning for long haul cables may become even more difficult, because it becomes necessary to optimize cable path planning over a network with a large number of (e.g., billions of) nodes. Another difficulty is the requirement to load data of billions of nodes into the computer.

To this end, the multi-resolution approach in one implementation of the method 200 may be helpful. The approach, in one example, iteratively adjust the path by diluting (coarsening) the resolution of the used data in areas away from the current path and increasing the resolution closer to the current path. The path of a submarine cable is obtained first based on the low-resolution representation of the landforms. Then refinement is then done segment-wise along the path based on the high-resolution representation. The refinement may be repeated as needed.

In one implementation of the invention, parallel processing is applied for path optimization and for loading the data into the computer(s)/processor(s). The validation of the iterative localized multi-resolution methods using high performance machines will enable reduced complexity algorithms that are important when HPC facilities are unavailable. Note that FMM used for solving the Eikonal equation is inherently sequential and hence highly time-consuming. J. Yang, F. Stern, *A highly scalable massively parallel Fast Marching Method for the Eikonal equation, Journal of Computational Physics* 332 (2017) 333-362 has disclosed a domain decomposition method that can be used to realize highly scalable massively parallel computing of FMM, which uses a method of restarting narrow-band. This method is adopted in one embodiment of the invention to the infrastructure link planning problem due to the large geography datasets with billions of nodes. A distributed computing platform with high performance computers or supercomputers may be used to solve the problem by using a load balancing scheduler and different threads and nodes, where the nodes are interconnected with high-performance switches. The distributed-memory parallel computation for FMM as disclosed in Yang, F. Stern, *A highly scalable massively parallel Fast Marching Method for the Eikonal equation, Journal of Computational Physics* 332 (2017) 333-362 will be adopted in one embodiment of the invention.

Figure 3:
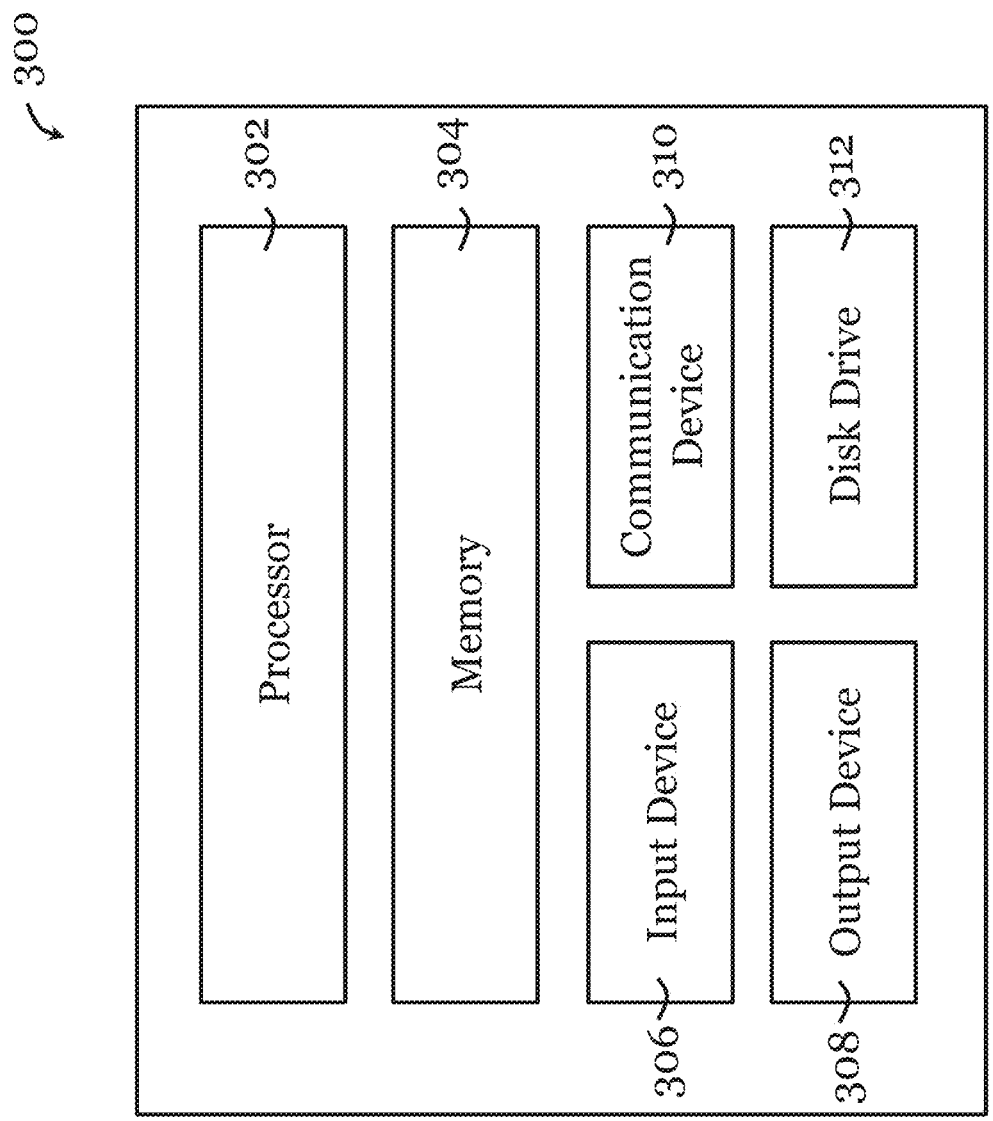
FIG. 3 is a block diagram of an information handling system operable to implement the method of FIG. 1 and/or the method of FIG. 2.

Referring to FIG. 3, there is shown a schematic diagram of an exemplary information handling system 300 that can be used as a server or other information processing systems in one embodiment of the invention. The information handling system 300 may be arranged to implement part or all of the method 100 of FIG. 1 and/or part or all of the method 200 of FIG. 2. The information handling system 300 may have different configurations, and it generally comprises suitable components necessary to receive, store, and execute appropriate computer instructions, commands, or codes. The main component of the information handling system 300 is a processor 302 and, optionally, a memory unit 304. The processor 302 may be formed by one or more of: CPU, MCU, controllers, logic circuits, Raspberry Pi chip, digital signal processor (DSP), application-specific integrated circuit (ASIC), Field-Programmable Gate Array (FPGA), or any other digital or analog circuitry configured to interpret and/or to execute program instructions and/or to process data. The memory unit 304 may include one or more volatile memory unit (such as RAM, DRAM, SRAM), one or more non-volatile memory unit (such as ROM, PROM, EPROM, EEPROM, FRAM, MRAM, FLASH, SSD, NAND, and NVDIMM), or any of their combinations. Preferably, the information handling system 300 further includes one or more input devices 306 such as a keyboard, a mouse, a stylus, an image scanner, a microphone, a tactile input device (e.g., touch sensitive screen), and an image/video input device (e.g., camera). The information handling system 300 may further include one or more output devices 308 such as one or more displays (e.g., monitor), speakers, disk drives, headphones, earphones, printers, 3D printers, etc. The display may include a LCD display, a LED/OLED display, or any other suitable display that may or may not be touch sensitive. The information handling system 300 may further include one or more disk drives 312 which may encompass solid state drives, hard disk drives, optical drives, flash drives, and/or magnetic tape drives. A suitable operating system may be installed in the information handling system 300, e.g., on the disk drive 312 or in the memory unit 304. The memory unit 304 and the disk drive 312 may be operated by the processor 302. The information handling system 300 also preferably includes a communication device 310 for establishing one or more communication links (not shown) with one or more other computing devices such as servers, personal computers, terminals, tablets, phones, or other wireless or handheld computing devices. The communication device 310 may be a modem, a Network Interface Card (NIC), an integrated network interface, a radio frequency transceiver, an optical port, an infrared port, a USB connection, or other wired or wireless communication interfaces. The communication links may be wired or wireless for communicating commands, instructions, information and/or data. Preferably, the processor 302, the memory unit 304, and optionally the input devices 306, the output devices 308, the communication device 310 and the disk drives 312 are connected with each other through a bus, a Peripheral Component Interconnect (PCI) such as PCI Express, a Universal Serial Bus (USB), an optical bus, or other like bus structure. In one embodiment, some of these components may be connected through a network such as the Internet or a cloud computing network. A person ordinarily skilled in the art would appreciate that the information handling system 300 shown in FIG. 3 is merely exemplary and different information handling systems 300 with different configurations may be applicable in the invention.

Figure 4:
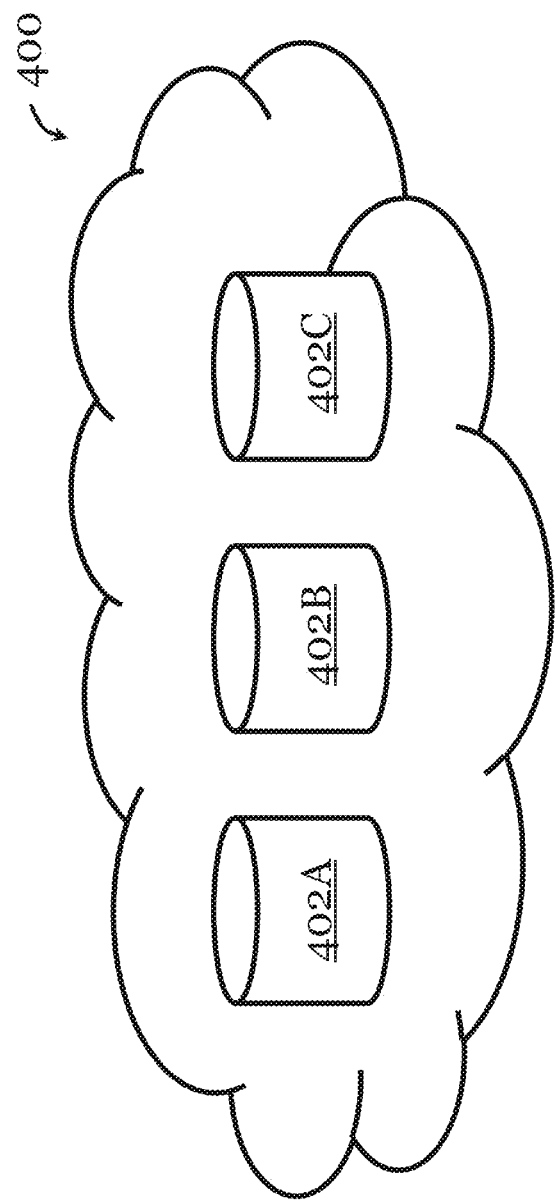
FIG. 4 is a schematic diagram of a system for determining a path arrangement of an infrastructure link in one embodiment of the invention.

FIG. 4 shows an exemplary system 400 for performing the method 100 of FIG. 1 and/or the method 200 of FIG. 2. The system 400 includes multiple (in this example, three) processors operably connected with each other for implementing a parallel processing method in performing the method 100 of FIG. 1 and/or the method 200 of FIG. 2. J. Yang, F. Stern, *A highly scalable massively parallel Fast Marching Method for the Eikonal equation, Journal of Computational Physics* 332 (2017) 333-362 has disclosed a domain decomposition method operable to realize the highly scalable massively parallel computing of fast marching method (one example of the basis of the path arrangement determination model). This method can be implemented using the system 400 for the distributed-memory parallel computation for fast marching method.

The inventors of this invention have also realized, through research, experiments, and/or trials, that one important aspect of infrastructure link path planning is the determination or quantization of seismic hazard, and that detailed information about seismic ground motion, such as peak ground velocity (PGV) and peak ground acceleration (PGA) of onshore areas and offshore areas (e.g., the ocean floor) is important for infrastructure link path planning. The inventors of this invention have realized that many areas in the world only has limited earthquake hazard information available, e.g., fault types and locations, locations of epicentres of past earthquakes, and the earth's surface maps, and that there is a need to address this lack of sufficient data issue for properly planning infrastructure link path arrangement, by complementing seismic data in areas where such data is limited or even unavailable.

In this disclosure, "area of known hazards" may include one or more known seismically-active area, which may be onshore areas, offshore areas, or both; "area of unknown hazards" may include area in which actual geological and/or seismological data is limited, incomplete, or non-existent, and which may include onshore areas, offshore areas, or both.

Figure 5:
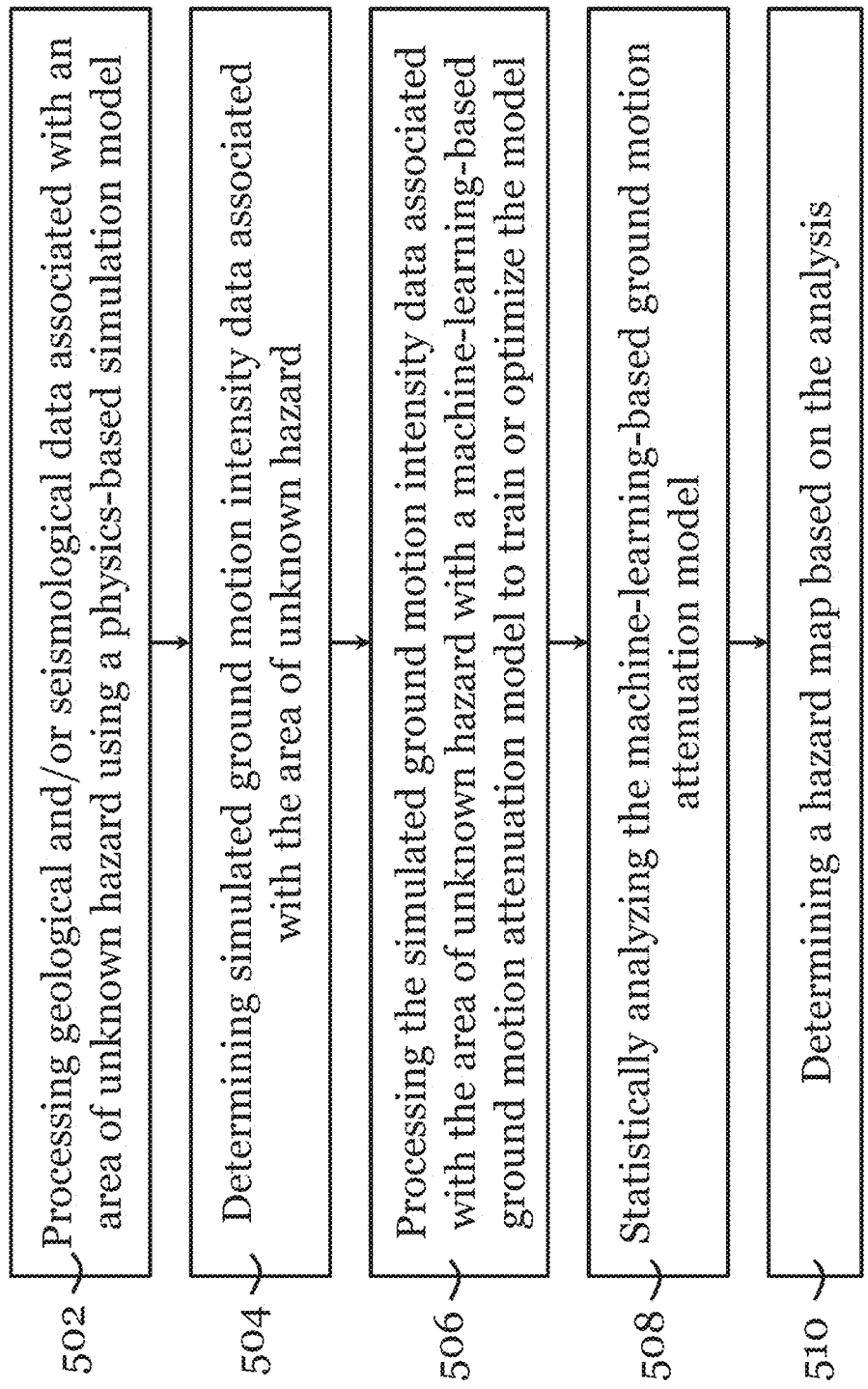
FIG. 5 is a flowchart of a method for determining seismic related data in one embodiment of the invention.

FIG. 5 shows a method 500 for determining seismic hazard related data, in particular for area in which such data is limited, incomplete, or non-existent, in one embodiment of the invention. The method 500 begins in step 502, in which geological and/or seismological data associated with an area of unknown hazard using a simulation model. The method then proceeds to step 504, in which simulated ground motion intensity data associated with the area of unknown hazard is determined based on the processing in step 502. The simulation model is determined based on geological and/or seismological data associated with an area of known hazard and ground motion intensity data associated with the area of known hazard, and the model may correlate (e.g., statistically correlate) geological and/or seismological data with ground motion intensity data.

In this embodiment the simulation model is a physics-based simulation model. In the physics-based simulation model, ground motions are simulated using physics-based methods, such has those disclosed in B. A. Bradley, *Ongoing challenges in physics-based ground motion prediction and in-sights from the 2010-2011 Canterbury and 2016 Kaikoura, New Zealand earthquakes, Soil Dynamics and Earthquake Engineering* (2018), C. A. Goulet et. al., *The scec broadband platform validation exercise: Methodology for code validation in the context of seismic-hazard analyses, Seismological Research Letters* 86 (2014) 17-26, and R. Graves, A. Pitarka, *Kinematic ground-motion simulations on rough faults including effects of 3D stochastic velocity perturbations, BSSA* 106 (2016) 2136-2153.

The physics-based simulation model may be formed from or with a machine learning algorithm. The machine learning algorithm may be a supervised machine learning algorithm. The supervised machine learning algorithm may apply classification techniques or use classifier approaches. Examples of these classification techniques or classifier approaches include Bayesian classifiers, support vector machine (SVM), convolutional neural networks (CNN) and random forests techniques. In the supervised machine learning algorithm, geological and/or seismological data associated with an area of known hazard can be used as input; and ground motion intensity data associated with the area of known hazard can be used as the output corresponding to the input, the model learns or otherwise determines a correlation between the input and the output. The supervised machine learning algorithm may learn or otherwise determine spatial distribution and attenuation of ground motion around a fault rupture. Although not illustrated, the method 500 may include, prior to step 502, determining the simulation model, e.g., by building, training, and/or optimizing the simulation model, optionally a machine learning algorithm as described.

In this embodiment, the geological and/or seismological data associated with the area of known hazard may include data relating to one or more of: topography data, ground motion data, hazard information, historical earthquake magnitudes, fault rupture area, fault mechanism, site condition, focal depth, and soil types. The geological and/or seismological data associated with an area of unknown hazard may include data relating to one or more of: topography data, ground motion data, hazard information, historical earthquake magnitudes, fault rupture area, fault mechanism, site condition, focal depth, and soil types. The data associated with the area of unknown hazard is less dense or less complete than the data associated with the area of known hazard. The geological and/or seismological data associated with the area of unknown hazard may include the geological and/or seismological data associated with an area of known hazard, in which the area of known hazard and the area of unknown hazard are of similar tectonic properties. Ground motion intensity data associated with the area of known hazard include spatial distribution of ground motion with respect to a fault rupture in the area of known hazard and/or attenuation of ground motion with respect to a fault rupture in the area of known hazard. Specific examples include peak ground velocity, peak ground acceleration, and spectral acceleration at first mode of vibration. Simulated ground motion intensity data associated with the area of unknown hazard may correspondingly include simulated spatial distribution of ground motion in the area of unknown hazard with respect to a fault rupture in the area of unknown hazard and/or simulated attenuation of ground motion with respect to a fault rupture in the area of unknown hazard. Specific examples include peak ground velocity, peak ground acceleration, and spectral acceleration at first mode of vibration.

In one implementation, the tectonic settings of the area of unknown hazard is compared with the tectonic settings of the area of known hazard to determine a similarity score, and the processing in step 502 is performed only if the similarity score is above a predetermined threshold score. In another implementation, the tectonic settings of the area of unknown hazard is compared with respective tectonic settings of different areas of known hazard to determine a respective similarity score, and the processing in step 502 is performed using the area(s) of known hazard with the highest similarity score(s). Some examples may involve the selection of the most suitable physics-based simulation model from a number of them.

Optionally, the simulated ground motion intensity data associated with the area of unknown hazard, as determined in step 504, may be combined (e.g., added, weighted, and/or averaged) with the ground motion intensity data associated with the area of known hazard. The simulated ground motion intensity data associated with the area of unknown hazard, as determined in step 504, may be presented to a user, e.g., via a display. The simulated ground motion intensity data may be displayed along with the simulated ground motion intensity data associated with the area of known hazard (obtained from the simulation model) and/or (known) ground motion intensity data associated with the area of known hazard. The simulated ground motion intensity data may be overlaid on a map of a modelled geographic terrain, such as that described with respect to FIG. 1.

The geological and/or seismological data associated with an area of known hazard may be processed using the simulation model to determine simulated ground motion intensity data associated with the area of known hazard. Afterwards, the determined simulated ground motion intensity data associated with the area of known hazard can be compared with the ground motion intensity data associated with the area of known hazard. The comparison can be used to optimize the simulation model. Filtering may be applied to the data for further optimization.

The physical-based simulation model may be used to complement missing seismic data. Ground motion from fault rupture to the ocean floor may be modelled.

After step 504, the method 500 then processes the simulated ground motion intensity data associated with the area of unknown hazard, obtained from step 504, with a machine-learning-based ground motion attenuation model, in step 506. In this step, the processing may be used to train or optimize the machine-learning-based ground motion attenuation model.

This machine-learning-based ground motion attenuation model can be determined based on: geological and/or seismological data associated with an area of unknown hazard; geological and/or seismological data associated with an area of known hazard; ground motion intensity data associated with the area of known hazard; and simulated ground motion intensity data associated with the area of known hazard, and optionally, predetermined simulated ground motion intensity data associated with the area of unknown hazard. The machine-learning-based ground motion attenuation model is arranged to correlate, e.g., statistically correlate, these data. The machine-learning-based model may be formed from or with a supervised machine learning algorithm, such as one that applies classification techniques or use classifier approaches. Examples of these classification techniques or classifier approaches include Bayesian classifiers, support vector machine (SVM), convolutional neural networks (CNN) and random forests techniques. The supervised machine learning algorithm may learn or otherwise determine spatial distribution and attenuation of ground motion around a fault rupture. Although not illustrated, the method 500 may include, prior to step 506, determining the simulation model, e.g., by building, training, and/or optimizing the simulation model, optionally a machine learning algorithm as described.

Subsequently, in step 508, probabilistic seismic hazard analysis is applied to the ground motion attenuation model to determine respective probability of exceeding various levels of ground motion estimated over a specified time period. After step 508, then analysis results can be presented. e.g., display, in the form of a hazard map, optionally overlaid on a map of a modelled geographic terrain, such as that described with respect to FIG. 1.

Figure 6:
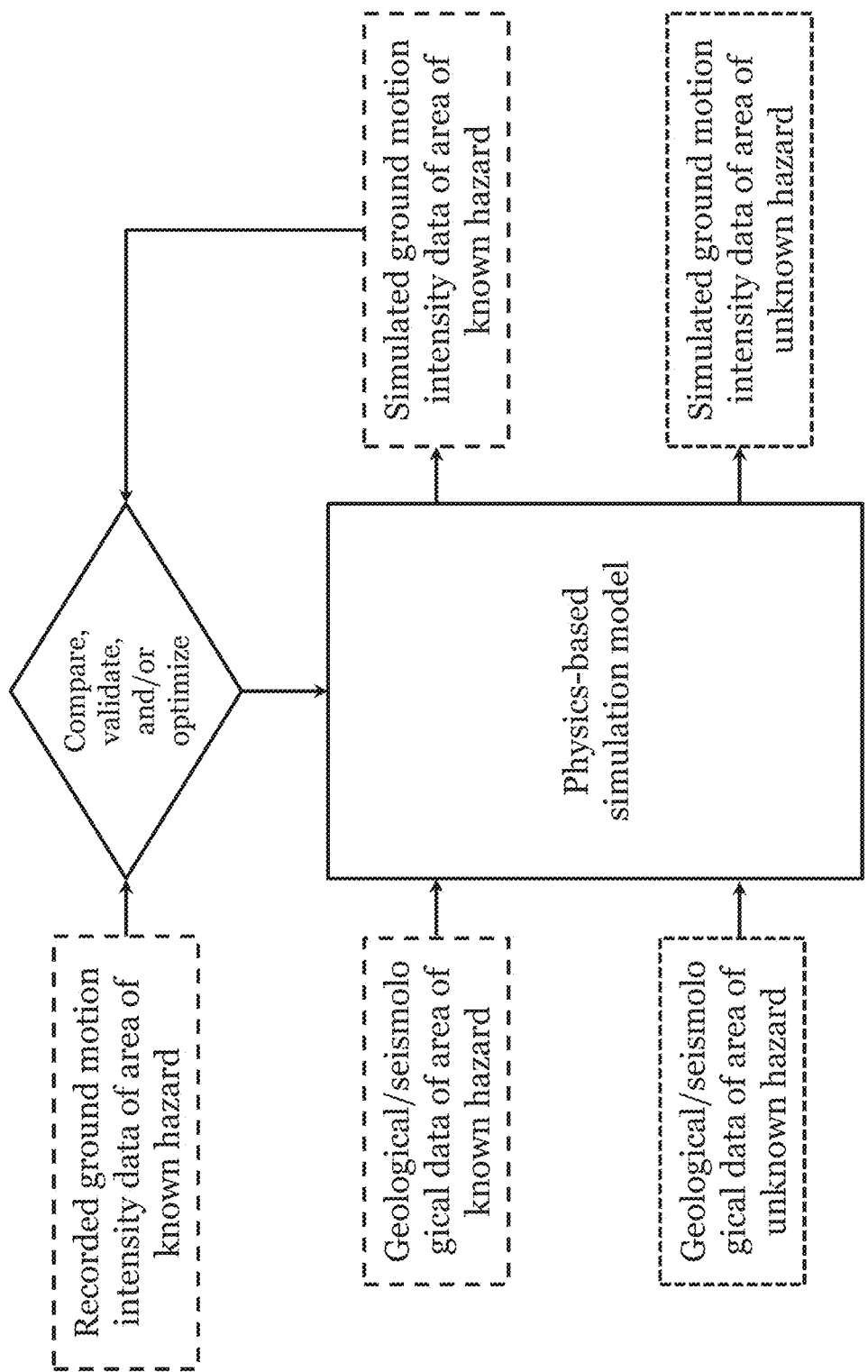
FIG. 6 is a schematic diagram of a physics-based simulation method for determining seismic related data in one embodiment of the invention.
Figure 7:
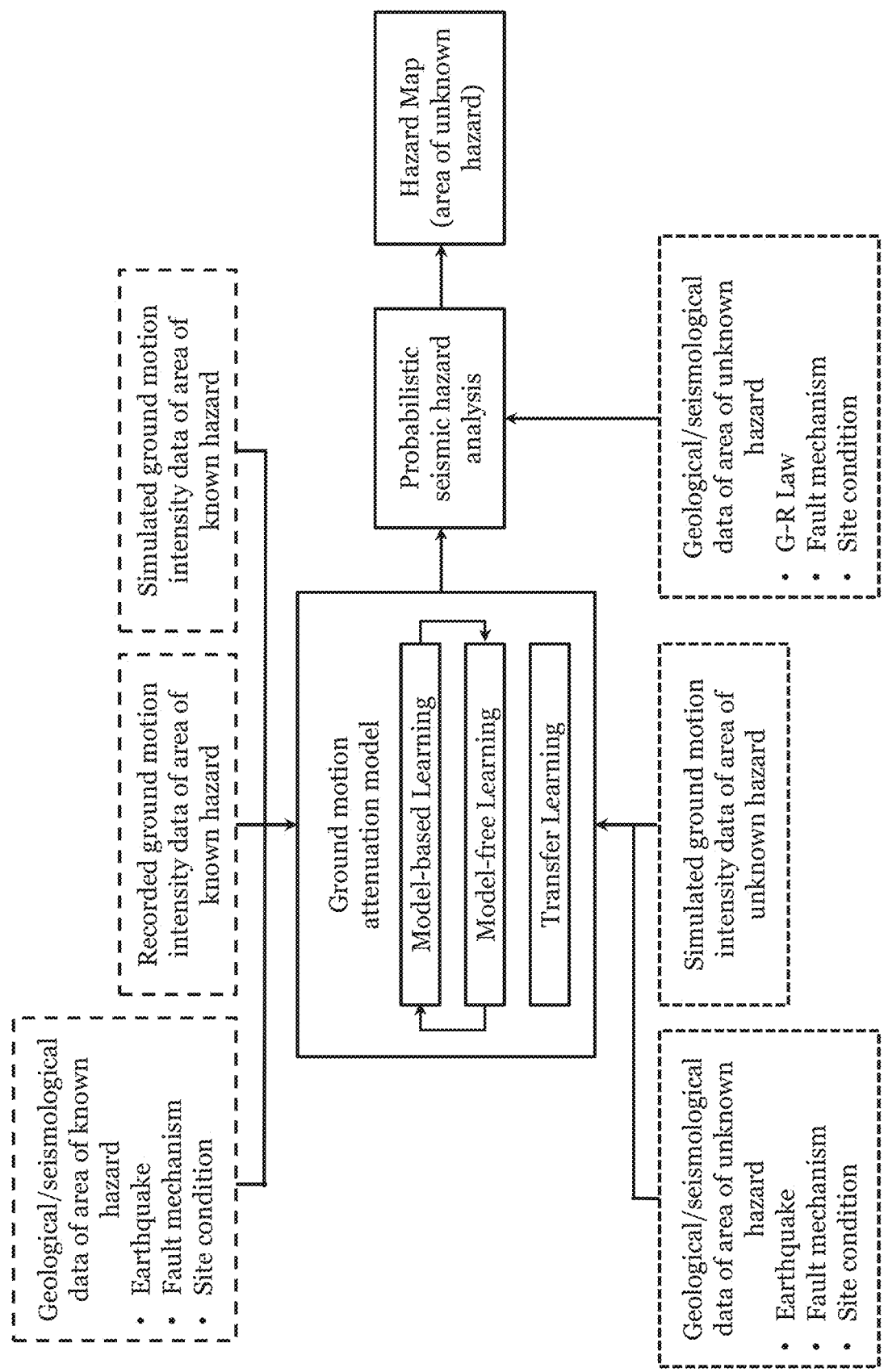
FIG. 7 is a schematic diagram of a machine-learning-based simulation method in one embodiment of the invention.
Figure 8:
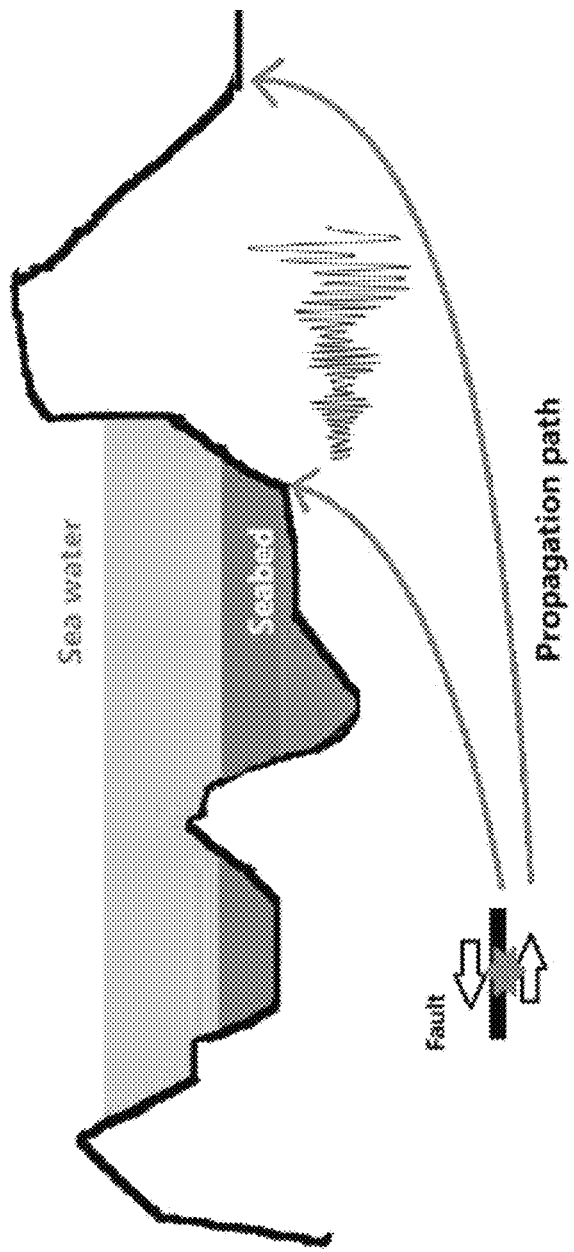
FIG. 8 is a schematic diagram of ground motion simulation on ocean floor in one embodiment of the invention.

FIGS. 6 to 8 are at least partly described above with reference to FIG. 5.

In the above implementation, the missing seismic data can be obtained using machine learning method. Seismic hazard can be quantified or otherwise determined and presented (e.g., in the form of hazard maps) from limited topographic and seismological data. Both scenario-based and probabilistic-based methodologies can be applied (e.g., to assess the probability of ground motion (e.g., PGV) exceeding a certain value (e.g., 5 cm/s) in the next 50 years). The hazard maps can be used in the field of earthquake engineering. In one implementation, the method uses comprehensive ground motion data sets available from USGS and other aforementioned data source. One example of a seismic hazard map for area of known hazard only can be obtained from USGS.

Simulation, machine learning, and modelling techniques can be applied to these detailed data to obtain best estimates of ground motion distribution in area of unknown hazard. In the first (simpler) approach, the recorded motions in seismically active regions, such as California, are used to train ground motion attenuation models. Different classifier approaches such as Bayesian classifiers, support vector machine (SVM), convolutional neural networks (CNN), and random forests are used to learn spatial distribution and attenuation of ground motion around fault rupture. It is envisaged that the attenuation models developed for area of known hazard can be suitably applied for generating ground-motion map for area of unknown hazard with similar tectonic settings. The second approach is to derive accurate seismic hazard map for area of unknown hazard based on integration of physics-based simulation methods and machine learning methods, as described in greater detail below.

FIG. 6 illustrates a physics-based simulation method for determining seismic related data in one embodiment of the invention.

In one embodiment, physics-based simulation is used to produce ground motion intensities for area of known hazard by applying the methods disclosed in G. Wang et. al., *Parametric models for 3D topographic amplification of ground motions considering subsurface soils, Soil Dynamics and Earthquake Engineering* 115 (2018) 41-54 and D. Huang et. al., *A physics-based integrated sem-newmark model for regional-scale coseismic landslide assessment, in: Proc. ICEGE*, Roma, Italy, 2019. Accordingly, in one embodiment, spectral element method (SEM) for regional-scale wave propagation and ground motions amplification on complex topography. The physics-based simulation method can be validated and optimized by comparing the simulated ground motion data with the recorded ground motion data of area of known hazard. Then, for area of unknown hazard, physics-based simulation will be used to model ground motion from fault rupture to the ocean floor, schematically illustrated in FIG. 8. Three important effects need to be considered together.

The first effect is earthquake scenarios. In one implementation, fault distribution and rupture scenarios are taken into account.

The second effect is topographic effects. The ocean floor has significant elevation variation. Due to the focusing or defocusing of seismic waves, ground motions are usually amplified at convex features such as ridges and hills, and de-amplified at concave features such as canyons and valleys. In one implementation, 3D numerical simulations area applied to predict or estimate the observed topographic amplification.

The third effect is seabed amplification. The ocean floor is usually comprised of thick layers of loose sands, silts, silty sands and very soft clay. These offshore sediments exhibit highly nonlinear stress-strain behaviors, and would significantly affect the ground motion distribution and cable layout. There is a need to model coupling effects between terrain and subsurface soil, because the scattering and diffraction of waves in the near-surface layer at low speeds leads to complex wave distribution patterns. As a result, a coupled three-dimensional topography-soil amplification analysis may be performed to assess terrain magnification.

By applying the physics-based simulation disclosed above, large amount of scenario-based ground motion intensity data for different locations of area of unknown hazard can be obtained.

FIG. 7 illustrates a machine-learning-based simulation method in one embodiment of the invention.

In one embodiment, based on the data of both area of known hazard and area of unknown hazard (including the ground motion intensity data obtained by the physics-based simulation method above), the attenuation models of ground motion intensities are obtained using two different formulations of supervised machine learning methods: category-based classification and regression models. The first one is a classification problem, where each class is used to indicate ground motion intensities with different scales. Different thresholds will be tested to discretize the ground motion intensity in the training data. The recorded motions of area of known hazard and simulated motions of area of unknown hazard can be used as datasets (including train, dev and test sets) of classifiers as long as the tectonic setting is similar to the tectonic setting in ocean environment. Multiple classification models may be used, including SVM, CNN, and random forest to learn ground-motion attenuation models. For each model, multiple sets of hyper-parameters will be tested in order to optimize the training performance. Transfer learning may be adopted in one embodiment to speed up the training process and improve the performance the predictive models.

In one embodiment, to address variations of data resolution, regression models such as linear, Lasso and Jackknife regression, and multiscale CNNs can be applied. In one implementation, taking into account the spatial correlation of ground motions, Bayesian compressive sensing with Karhunen-Loeve expansion (BCS-KL) random field generator can be used to generate high-resolution data from sparse measurements. This addresses the problem of different data resolution. Having results for the ground motion attenuation models from the two approaches, the results can be used to validate each other to correct, reduce, or even eliminate inconsistencies. Details of BCS-KL generator can be seen from Y. Wang et. al., *Direct simulation of random field samples from sparsely measured geotechnical data with consideration of uncertainty in interpretation, Canadian Geotechnical Journal* 55 (2017) 862-880, S. Montoya-Noguera et. al., *Simulation of non-stationary non-gaussian random fields from sparse measurements using bayesian compressive sampling and Karhunen-Loeve expansion, Structural Safety* 79 (2019) 66-79, and Y. Wang et. al., *Simulation of random fields with trend from sparse measurements without detrending, Journal of Engineering Mechanics* 145 (2018) 04018130.

Based on the attenuation models of ground motion intensities derived above, taking account of uncertainties in earthquake source, path, and site conditions, seismic hazard maps can be produced based on probabilistic seismic hazard analysis (PSHA) which determines the probability of exceeding various levels of ground motion estimated over a specified period of time. The seismic hazard map can be used in determining path planning solutions in the methods of infrastructure link path arrangement determination disclosed herein.

The set of data used in the methods of FIGS. 5 to 8 may include the set of data used in the methods 100, 200 as described above.

The methods described with respect to FIGS. 5 to 8 can be implemented using one or more of the information handling devices of FIG. 3 or the system of FIG. 4, details of which are not repeated for brevity.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects, and/or components to achieve the same functionality desired.

It will also be appreciated that where the methods and systems of the invention are either wholly implemented by computing system or partly implemented by computing systems then any appropriate computing system architecture may be utilized. This will include stand-alone computers, network computers, dedicated or non-dedicated hardware devices. Where the terms "computing system" and "computing device" are used, these terms are intended to include any appropriate arrangement of computer, information handling system, or information processing hardware capable of implementing the function described.

The above embodiments with respect to infrastructure links path arrangement provide a computationally efficient way to determine infrastructure link path arrangement, in particular an optimal one in view of various constraints and factors, in a semi-automatic or automatic manner. Usually the more the amount of data used, the more accurate the determined result (path arrangement). However, this comes with a computational speed and/or computational resource penalty. One embodiment of the invention applies a multi-resolution or multi-size scaling approach to overcome the problem posed by data size (being too massive). In one example, the multi-resolution or multi-size approach starts from low resolution gridding and suitably spatially averaged data and iteratively and locally refining resolution, only where required, to find the optimal path arrangement at the fidelity achievable for the data. In some implementations parallelization is used to implement the existing provably optimal algorithms and to load the data into the computer for improved efficiency. Domain decomposition method may be applied to realize highly scalable massively parallel computing of a shortest path algorithm on a continuous 2D manifold in 3D space of the modelled geographic terrain. The use of distributed computing enables the loading of massive amount of data into the system. The optimal solutions achieved by parallel processing will help assess and calibrate the multi-resolution algorithms, which may be important when facilities for parallel processing are unavailable. In one example, the optimization is scalable to achieve path planning for infrastructure links that are over 5,000 km long and the resolution of the maps of the earth's surface and existing cables may be at most 30 m distance between any two adjacent nodes. In some implementations the determination will provide one or more path arrangement(s) for least cost based on a given risk (quantified, exact value or range), or for least risk based on a given cost (exact value or range). The determined path arrangement(s) will be at least partly optimal in view of one or more constraints, resulting in a more robust infrastructure link network, which may be deployed, operated, repaired, serviced, or otherwise arranged cost effectively. Human errors in the determination can be reduced.

The above embodiments with respect to seismic hazard related data determination (or quantification) provide a means to fill in the knowledge gap—to provide seismic data for area with limited amount of such information or data. Machine learning algorithms are used to learn the relationship between topography and limited seismic historical information and detailed ground motion information in areas where both are available to infer hazard maps in areas where information is limited. New seismic simulations can be applied for further learning and to improve hazard map accuracy. The above embodiments quantify seismic hazard from limited past earthquake data to generate hazard maps for cable path planning in target areas where detailed data of seismic ground motion is unavailable.

The above embodiments, when suitably combined, provide a time-efficient or resource-efficient method for infrastructure link path optimization using the models and hazard maps developed by physics-based simulation method and machine learning techniques. These embodiments can generate rigorous solutions for the least cable cost for a given risk, or the least cable risk for a given cost, given the generated seismic hazard quantification data in the target areas taking account of multiple objectives of both cost and risk.

It will be appreciated by persons skilled in the art that numerous variations and/or modifications may be made to the invention as shown in the specific embodiments without departing from the scope of the invention as broadly described and defined in the claims. The described embodiments of the invention should therefore be considered in all respects as illustrative, not restrictive. The embodiments of methods for determining seismic hazard related data, such as those described with respect to FIGS. 5 to 8, can be selectively or otherwise optionally combined with the embodiments of methods for determining infrastructure links path arrangement, in any way that is reasonable to the skilled person.

Various modifications can be made with respect to the systems and methods for determining infrastructure links path arrangement. For example, while the method and system of the invention can be applied for determining path arrangement of different types of infrastructure links, including but not limited to: cable (power/data/communication/etc.), pipeline (liquid/gas such as oil/water/fuel), or transportation link (road/railway/walkway). The infrastructure link can be onshore, offshore, or partly onshore and partly offshore. In one example, the path arrangement includes a path network with multiple paths (each may be formed by one or more curved or straight segments, optionally with branching). The paths may be connected. The paths may be connected to an existing infrastructure link network. In another example, the path arrangement includes a single path, e.g., formed by one or more curved or straight segments, optionally with branching. The single path may be a path connected to an existing infrastructure link network, or it may be a new path between two predetermined geographic locations, optionally with predetermined intermediate geographic location(s) through which the path has to pass. In yet another example, the path arrangement includes multiple possible paths (each may be formed by one or more curved or straight segments, optionally with branching). Each of the possible paths may pass through predetermined points/locations.

Various modifications can be made to the systems and methods for determining seismic hazard related data. For example, the simulation model need not be machine learning based. The simulation model, if it is machine-learning-based, can apply different forms of machine learning techniques. Ground motion intensity data and geological and/or seismological data may not be limited to those specifically described above.

The invention claimed is:

1. A computer-implemented method for determining naturally occurring seismic hazard related data, comprising:
processing geological and/or seismological data associated with an area of unknown hazard using a physics-based simulation model to determine simulated ground motion intensity data associated with the area of unknown hazard, wherein the physics-based simulation model has been determined at least partly based on geological and/or seismological data associated with an area of known hazard corresponding to a known seismically-active area and ground motion intensity data associated with the area of known hazard;
processing the determined simulated ground motion intensity data associated with the area of unknown hazard using a machine-learning-based ground motion attenuation model with a machine learning algorithm;
applying probabilistic seismic hazard analysis to the machine-learning-based ground motion attenuation model to determine a respective probability of exceeding various levels of ground motion estimated over a specified time period; and
determining, based on the applying of the probabilistic seismic hazard analysis, a seismic hazard map for the area of unknown hazard, the seismic hazard map being arranged to be used in determining a path arrangement of an infrastructure link in at least the area of unknown hazard; wherein the geological and/or seismological data associated with the area of known hazard comprises data relating to one or more of: topography data, ground motion data, hazard information, historical earthquake magnitudes, fault rupture area, fault mechanism, site conditions, focal depth, and soil types; wherein the geological and/or seismological data associated with the area of unknown hazard may include data relating to one or more of: topography data, ground motion data, hazard information, historical earthquake magnitudes, fault rupture area, fault mechanism, site conditions, focal depth, and soil types; and wherein the geological and/or seismological data associated with the area of unknown hazard is less dense or less complete than the geological and/or seismological data associated with the area of known hazard.

2. The computer-implemented method of claim 1, wherein the physics-based simulation model is arranged to correlate geological and/or seismological data with ground motion intensity data.

3. The computer-implemented method of claim 2, wherein the ground motion intensity data associated with the area of known hazard comprises one or more of:
peak ground velocity;
peak ground acceleration; and
spectral acceleration at first mode of vibration.

4. The computer-implemented method of claim 3, wherein the simulated ground motion intensity data associated with the area of unknown hazard comprises one or more of:
peak ground velocity;
peak ground acceleration; and
spectral acceleration at first mode of vibration.

5. The computer-implemented method of claim 1, further comprising:
prior to the processing using the physics-based simulation model, comparing tectonic settings of the area of unknown hazard with respective tectonic settings of a plurality of areas of known hazard to determine a respective similarity score; and
determining the area of known hazard with the highest similarity score; and wherein the determined area of known hazard with the highest similarity score is the same area as the area of known hazard based on which the physics-based simulation model is determined.

6. The computer-implemented method of claim 1, wherein the geological and/or seismological data associated with the area of unknown hazard comprises the geological and/or seismological data associated with the area of known hazard, in which the area of known hazard and the area of unknown hazard are of similar tectonic properties.

7. The computer-implemented method of claim 1, further comprising:
combining the simulated ground motion intensity data associated with the area of unknown hazard with the ground motion intensity data associated with the area of known hazard.

8. The computer-implemented method of claim 1, further comprising:
presenting the simulated ground motion intensity data associated with the area of unknown hazard.

9. The computer-implemented method of claim 1, further comprising:
prior to the processing, determining the physics-based simulation model.

10. The computer-implemented method of claim 9, wherein determining the simulation model includes:
building, training, and/or optimizing the physics-based simulation model.

11. The computer-implemented method of claim 1, further comprising:
processing geological and/or seismological data associated with the area of known hazard using the physics-based simulation model;
determining, based on the processing, simulated ground motion intensity data associated with the area of known hazard;
comparing the determined simulated ground motion intensity data associated with the area of known hazard and the ground motion intensity data associated with the area of known hazard; and
optimizing the physics-based simulation model based on the comparison.

12. The computer-implemented method of claim 1, further comprising:
determining the machine-learning based ground motion attenuation model based on: geological and/or seismological data associated with the area of unknown hazard; geological and/or seismological data associated with the area of known hazard; ground motion intensity data associated with the area of known hazard; simulated ground motion intensity data associated with the area of unknown hazard; and simulated ground motion intensity data associated with the area of known hazard.

13. The computer-implemented method of claim 12, wherein determining the machine-learning based ground motion attenuation model includes:
building, training, and/or optimizing the machine-learning based ground motion attenuation model.

14. The computer-implemented method of claim 1, further comprising:
presenting the analysis result.

15. A computer-implemented method for determining a path arrangement of an infrastructure link, comprising:
receiving one or more inputs each indicative of a constraint;
processing the one or more inputs and a set of data based on a path arrangement determination model, the set of data including data representing one or more factors affecting the path arrangement; and
determining, based on the processing, the path arrangement of the infrastructure link; wherein the processing comprises iteratively processing the set of data at increasing resolution or size based on the path arrangement determination model; and wherein the set of data includes the seismic hazard map determined from the method of claim 1.

16. A system for determining a path arrangement of an infrastructure link, comprising:
one or more processors arranged to:
receive one or more inputs each indicative of a constraint;
process the one or more inputs and a set of data based on a path arrangement determination model, the set of data including data representing one or more factors affecting the path arrangement; and
determine, based on the processing, the path arrangement of the infrastructure link; wherein the one or more processors are arranged to iteratively process the set of data at increasing resolution or size based on the path arrangement determination model; and wherein the set of data includes the seismic hazard map determined from the method of claim 1.

17. A system for determining naturally occurring seismic hazard related data, comprising:
one or more processors; and
memory operably connecting with the one or more processors and storing a physics-based simulation model determined at least partly based on geological and/or seismological data associated with an area of known hazard and ground motion intensity data associated with the area of known hazard; wherein the one or more processors are arranged to
process geological and/or seismological data associated with an area of unknown hazard using the physics-based simulation model to obtain simulated ground motion intensity data associated with the area of unknown hazard;
process the determined simulated ground motion intensity data associated with the area of unknown hazard using a machine-learning-based ground motion attenuation model with a machine learning algorithm;
apply probabilistic seismic hazard analysis to the ground motion attenuation model to determine respective probability of exceeding various levels of ground motion estimated over a specified time period; and
determine, based on the applying of the probabilistic seismic hazard analysis, a seismic hazard map for the area of unknown hazard, the seismic hazard map being arranged to be used in determining a path arrangement of an infrastructure link in at least the area of unknown hazard; wherein the geological and/or seismological data associated with the area of known hazard comprises data relating to one or more of: topography data, ground motion data, hazard information, historical earthquake magnitudes, fault rupture area, fault mechanism, site conditions, focal depth, and soil types; wherein the geological and/or seismological data associated with an area of unknown hazard may include data relating to one or more of: topography data, ground motion data, hazard information, historical earthquake magnitudes, fault rupture area, fault mechanism, site conditions, focal depth, and soil types; and wherein the geological and/or seismological data associated with the area of unknown hazard is less dense or less complete than the geological and/or seismological data associated with the area of known hazard.

\* \* \* \* \*